United States Patent
Kim et al.

(10) Patent No.: US 7,694,868 B2
(45) Date of Patent: Apr. 13, 2010

(54) METHOD AND APPARATUS FOR MOUNTING AT LEAST TWO TYPES OF ELECTRONIC COMPONENTS

(75) Inventors: Kyeong-heon Kim, Changwon (KR); Tae-hun Kim, Changwon (KR); Dong-hee Kim, Changwon (KR)

(73) Assignee: Samsung Digital Imaging Co., Ltd., Suwon-si (KR)

(*) Notice: Subject to any disclaimer, the term of this patent is extended or adjusted under 35 U.S.C. 154(b) by 0 days.

(21) Appl. No.: 12/315,341

(22) Filed: Dec. 2, 2008

(65) Prior Publication Data

US 2009/0152329 A1    Jun. 18, 2009

(30) Foreign Application Priority Data

Dec. 12, 2007    (KR) .................. 10-2007-0129010

(51) Int. Cl.
*B23K 35/02* (2006.01)
*H05K 3/34* (2006.01)

(52) U.S. Cl. .............. 228/179.1; 228/245; 228/249; 29/840

(58) Field of Classification Search .......... 228/248.1, 228/248.5, 214, 215; 29/729, 829, 836, 840, 29/843, 831
See application file for complete search history.

(56) References Cited

U.S. PATENT DOCUMENTS 5,704,286 A * 1/1998 Takashima .................. 101/127
2001/0054770 A1 * 12/2001 Isaak .......................... 257/777

FOREIGN PATENT DOCUMENTS

| JP | 2000294914 A | * 10/2000 |
|---|---|---|
| KR | 10-2001-0077360 A | 8/2001 |
| KR | 20010077360 | * 8/2001 |

* cited by examiner

*Primary Examiner*—Jessica L. Ward
*Assistant Examiner*—Megha Mehta
(74) *Attorney, Agent, or Firm*—Drinker Biddle & Reath LLP

(57) ABSTRACT

Provided is a method and apparatus for mounting a plurality of electronic components. The method comprises mounting a first electronic component on a substrate; forming a mask on the substrate to expose the first electronic component and a region of the substrate on which a solder paste is to be applied; forming a guide on a portion of the mask disposed around the first electronic component; applying the solder paste onto the substrate by using a squeezer contacting a portion of the mask disposed around the region of the substrate on which the solder paste is to be applied; removing the guide and the mask; and mounting a second electronic component on the solder paste.

12 Claims, 4 Drawing Sheets

METHOD AND APPARATUS FOR MOUNTING AT LEAST TWO TYPES OF ELECTRONIC COMPONENTS

CROSS-REFERENCE TO RELATED PATENT APPLICATION

This application claims the benefit of Korean Patent Application No. 10-2007-0129010, filed on Dec. 12, 2007, in the Korean Intellectual Property Office, the disclosure of which is incorporated herein in its entirety by reference.

BACKGROUND

1. Field of the Invention

The present invention relates to a method and apparatus for mounting electronic components on a substrate.

2. Background

There are various kinds of electronic products, such as a digital camera, a cellular phone, a personal digital assistant (PDA), an MP3 player, and a personal multimedia player, on the market. Such electronic products are becoming more miniaturized for portability. Accordingly, more electronic components, such as semiconductor devices, should be mounted within a smaller area in the electronic products.

A conventional method of mounting electronic components includes printing a solder paste onto a substrate, mounting the electronic components on the solder paste, and reflow-soldering the electronic components.

Among the electronic components mounted on the substrate, there may be some exceptional electronic components having reliability under low temperature limits. Although conventional electronic components can withstand a temperature of about 260° C., some exceptional electronic components can withstand a temperature of just about 200° C. In order to mount the exceptional electronic components with the other electronic components on the same substrate, according to the conventional method, the exceptional electronic components have to be manually soldered on the substrate.

Another conventional method of mounting electronic components includes printing a first solder paste, mounting first electronic components, forming a mask covering the first mounted electronic components, printing a second solder paste by using the mask, and mounting second electronic components. However, if the first electronic components are thick, it is difficult to form the mask covering the thick first electronic components, and it is also very difficult to move a squeezer when applying the second solder paste.

Another conventional method includes mounting electronic components having reliability under different temperature limits on different substrates. However, this approach goes against the trend toward minimizing electronic products.

SUMMARY

The embodiments of the present invention provide a method and apparatus for mounting at least two types of electronic components, having reliability under different temperature limits, on the same substrate while minimizing damage, such as a crack in the electronic components.

According to an aspect of the present invention, there is provided a method of mounting at least two types of electronic components, the method comprising: preparing a substrate on which a first electronic component is mounted; forming a mask on the substrate to expose the first electronic component and a region of the substrate on which a solder paste is to be applied; forming a guide on a portion of the mask disposed around the first electronic component; applying the solder paste onto the substrate by using a squeezer contacting a portion of the mask disposed around the region of the substrate on which the solder paste is to be applied; removing the guide and the mask; and mounting a second electronic component on the solder paste.

The guide may be formed on the portion of the mask disposed around the first electronic component so as to prevent the solder paste from being introduced into the first electronic component.

Alternatively, the guide may be formed on a portion of the mask disposed between the first electronic component and the region of the substrate on which the solder paste is to be applied.

Furthermore, the guide may be formed on a portion of the mask between an opening through which the first electronic component is exposed and an opening through which the region of the substrate on which the solder paste is to be applied is exposed.

The guide may be further formed on an edge between the mask and the opening through which the first electronic component is exposed.

The solder paste may be applied by using the squeezer having at least one concave portion that accommodates the first electronic component and the guide. The solder paste may be applied by using the squeezer having a concave portion that accommodates both the first electronic component and the guide.

According to another aspect of the present invention, there is provided a method of mounting at least two kinds of electronic components, the method comprising: forming a first mask on a substrate to expose a region of the substrate on which a first solder paste is to be applied; applying the first solder paste onto the substrate by using a first squeezer; removing the first mask; mounting a first electronic component on the first solder paste; forming a second mask on the substrate on which the first electronic component is mounted to expose the first electronic component and a region of the substrate on which a second solder paste is to be applied; forming a guide on a portion of the second mask disposed around the first electronic component; applying the second solder paste onto the substrate by using a second squeezer having at least one concave portion that accommodates the first electronic component and the guide; removing the second mask and the guide; and mounting a second electronic component on the second solder paste.

The mounting of the first electronic component may comprise positioning the first electronic component on the first solder paste and applying heat at a first temperature, and the mounting of the second electronic component may comprise positioning the second electronic component on the second solder paste and applying heat at a second temperature that is different from the first temperature. The first temperature may be higher than the second temperature.

The applying of the first solder paste may comprise applying the first solder paste by using the first squeezer contacting a portion of the first mask disposed around the region of the substrate on which the first solder paste is to be applied, and the applying of the second solder paste may comprise applying the second solder paste by using the second squeezer contacting a portion of the second mask disposed around the region of the substrate on which the second solder paste is to be applied.

The first solder paste may be applied by using the first squeezer having no concave portion, and the second solder paste may be applied by using the second squeezer having a concave portion that accommodates the first electronic component and the guide.

According to another aspect of the present invention, there is provided an apparatus for mounting at least two types of electronic components, the apparatus comprising: a substrate on which a first electronic component is mounted; a mask formed on the substrate to expose the first electronic component and a region of the substrate on which a solder paste is to be applied; a guide formed on a portion of the mask disposed around the first electronic component; and a squeezer contacting a portion of the mask disposed around the region of the substrate on which the solder paste is to be applied.

The guide may be formed on a portion of the mask between an opening through which the first electronic component is exposed and an opening through which the region of the substrate on which the solder paste is to be applied is exposed.

The squeezer may have at least one concave portion that accommodates the first electronic component and the guide.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

The exemplary embodiments will now be described more fully with reference to the accompanying drawings, in which exemplary embodiments are shown.

FIGS. 1 through 11 are cross-sectional views and a plan view for explaining a method of mounting at least two types of electronic components, according to an embodiment of the present invention. The method of mounting of FIGS. 1 through 11 involves a surface mount packaging technology in which electronic components, are mounted on the same substrate by using at least two types of solder pastes.

In FIGS. 1 through 11, a first electronic component has a first temperature limit and a second electronic component has a second temperature limit that is lower than the first temperature limit. For example, the first electronic component includes a tall first electronic component and a short first electronic component that can be mounted irrespective of their heights.

Figure 1:
FIG. 1 is a cross-sectional view showing a first mask forming on a substrate according to an exemplary embodiment.

Referring to FIG. 1, a first mask 20 is formed on a substrate 10 to expose a region of the substrate 10 to which a first solder paste is to be applied.

The substrate 10 may be a printed circuit board (PCB) that is formed by printing a circuit line pattern, formed of a conductive material, such as copper, onto an insulating substrate. A PCB refers to a circuit board that positions electronic components and fixedly prints circuit lines connecting the electronic components onto a surface in order to densely mount the electronic components on the surface.

The substrate 10 may be a single-layer PCB, or a multi-layer PCB, i.e., a build-up PCB, in which a plurality of PCB layers are stacked. The multi-layer PCB can increase yield and achieve high density and minimization by precisely connecting wires between the PCB layers. Accordingly, the multi-layer PCB can be used in a cellular phone, a camera, a notebook computer, and the like, which require high integration and thin design.

The substrate 10 may be a through-hole PCB. Any PCB applicable to a surface mount packaging technology can be used.

As described above, the region of the substrate 10 on which the first solder paste is to be applied is determined, and the first mask 20, exposing the region of the substrate 10 on which the first solder paste is to be applied, is aligned on the substrate 10 on which a conductive circuit line pattern is formed. The first mask 20 has a first opening 12 through which the region of the substrate 10 on which the first solder paste is to be applied is exposed. The first mask 20 may be a thin metal plate such as a stainless steel printing plate.

Figure 2:
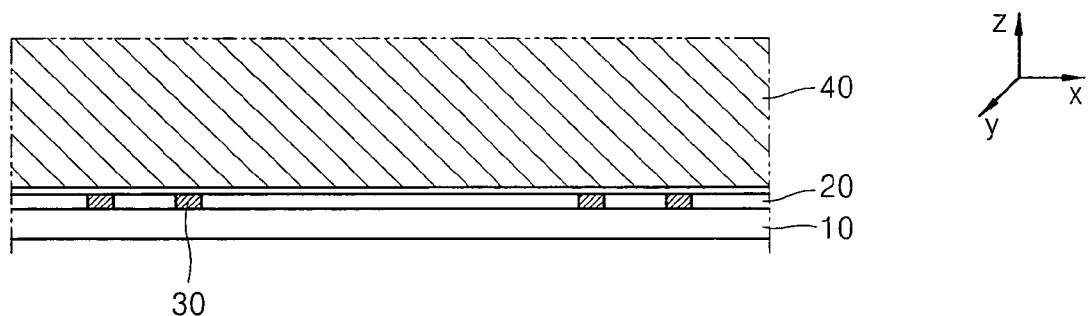
FIG. 2-3 are cross-sectional views showing a first solder paste being applied to a substrate according to an exemplary embodiment.

Referring to FIG. 2, a first solder paste 30 is applied to the substrate 10 on which the first mask 20 is aligned by moving a first squeezer 40 in a y-direction, such that the first solder paste 30 is introduced into the first opening 12 of the first mask 20. To this end, the first squeezer 40 must contact a portion of the first mask 20, which is around the region of the substrate 10 in which the first solder paste 30 is to be applied. Accordingly, the first solder paste 30 can be forced into the first opening 12 due to a predetermined pressure occurring when the first squeezer 40 is moved as the first squeezer 40 is applied.

Figure 3:
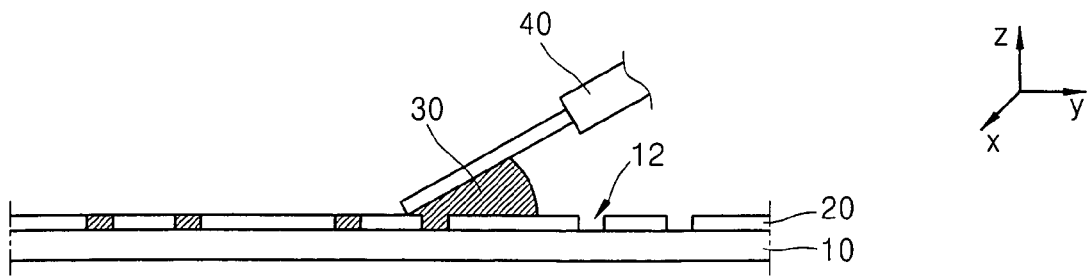

Referring to FIG. 3, the first solder paste 30 is forced into the first opening 12 by moving the first squeezer 40 in the y-direction. In detail, the first solder paste 30 is formed by continuously mixing solid alloy particles with a liquid flux. Accordingly, as the first squeezer 40 is moved on the first mask 20 in the y-direction, the first solder paste 30 is pushed into the first opening 12 to fill the first opening 12.

Figure 4:
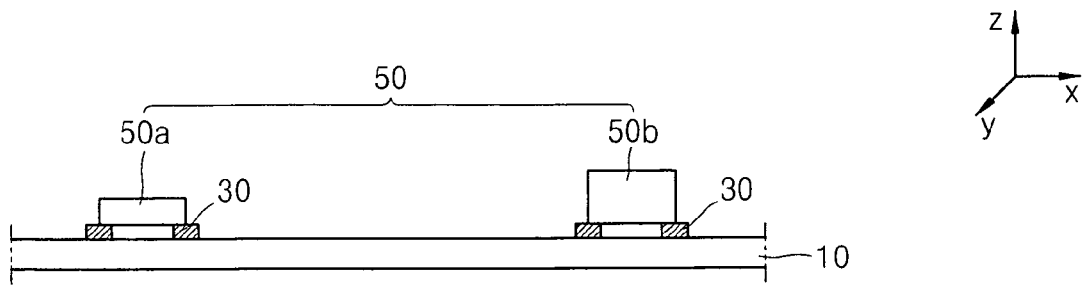
FIGS. 4-5 are cross-sectional views showing a first electronic component being mounted according to an exemplary embodiment.

After the first solder paste 30 is filled into the first opening 12, the first mask 20 is removed. Referring to FIG. 4, a short first electronic component 50a and a tall first electronic component 50b are positioned on the first solder paste 30 to form a first electronic component 50.

Figure 5:
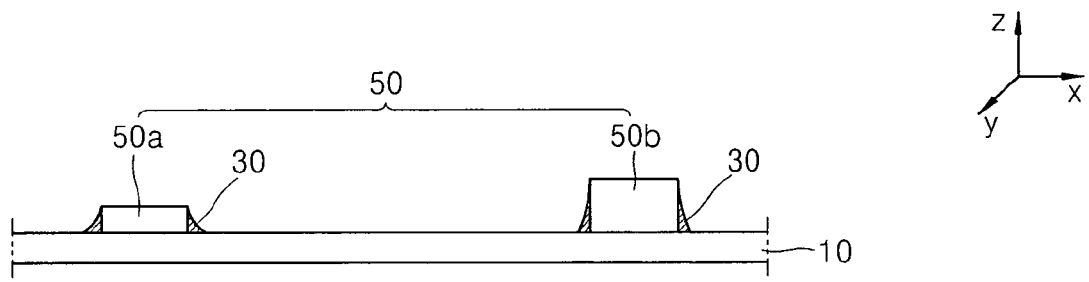

Referring to FIG. 5, the substrate 10, on which the first electronic component 50 is mounted, is subjected to a reflow process in an oven, such that the first solder paste 30 melts down and the first electronic component 50 is adhered to the substrate 10. A heat treatment temperature during the reflow process should be higher than a melting temperature, that is, a soldering temperature, of the first solder paste 30, and should be lower than a temperature that the first electronic component 50 can withstand. Accordingly, an upper limit of the heat treatment temperature should be determined by considering temperature limits under which the first electronic component 50 has reliability.

Figure 6:
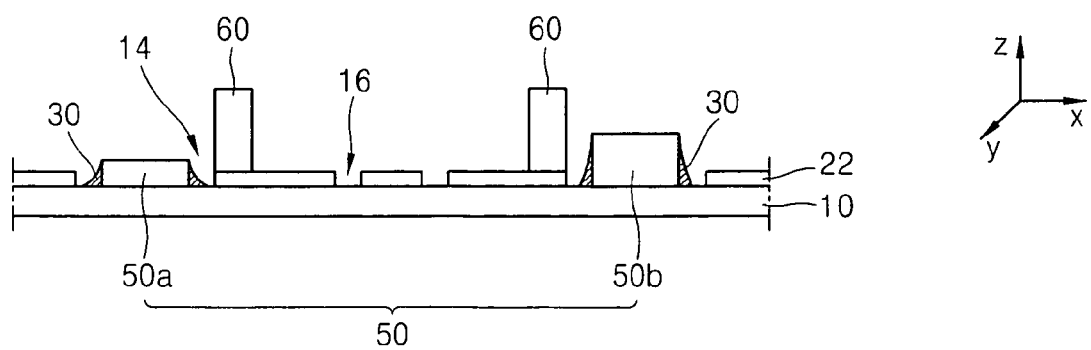
FIG. 6 is a cross-sectional view showing a second mask forming on a substrate according to an exemplary embodiment.

Referring to FIG. 6, a second mask 22 and guides 60 are sequentially formed on the substrate 10 on which the first electronic component 50 is mounted.

Figure 8:
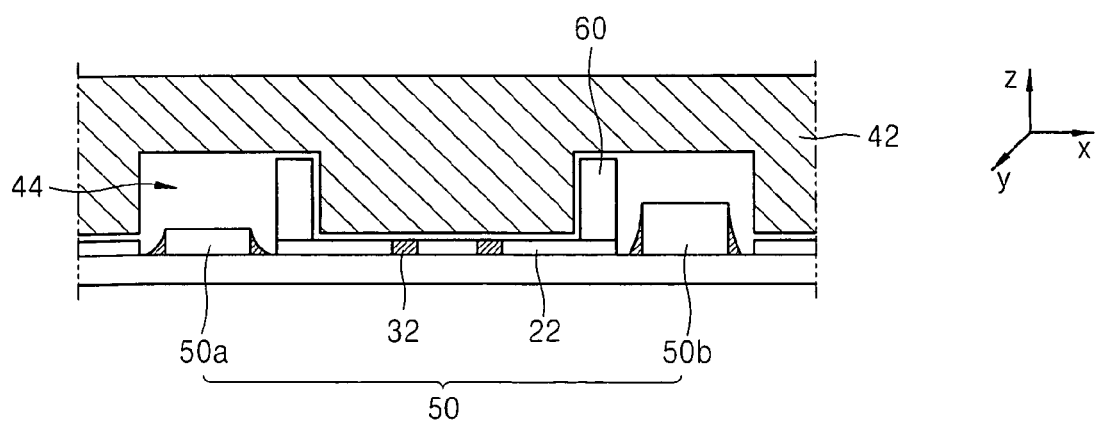
FIGS. 8-9 are cross-sectional views showing a second solder paste being applied to a substrate according to an exemplary embodiment.

The second mask 22 formed on the substrate 10 includes a second opening 14 through which the first electronic component 50 is exposed and a third opening 16 through which a region of the substrate 10, on which a second solder paste 32 of FIG. 8 is to be applied, is exposed. The second mask 22 may be a thin metal layer like the first mask 20.

The guide 60, formed on the second mask 22 barriers an introduction of the second solder paste into the first electronic component 50. The guide 60 is positioned on a portion of the second mask 22, which is between the first electronic component 50 and the region of the substrate 10 on which the second solder paste 32 is to be applied. Alternatively, the guide 60 may be formed on a portion of the second mask 22, which is between the second opening 14 through which the first electronic component 50 is exposed and the third opening 16 through which the region of the substrate 10 on which the second solder paste 32 is to be applied is exposed.

Figure 7:
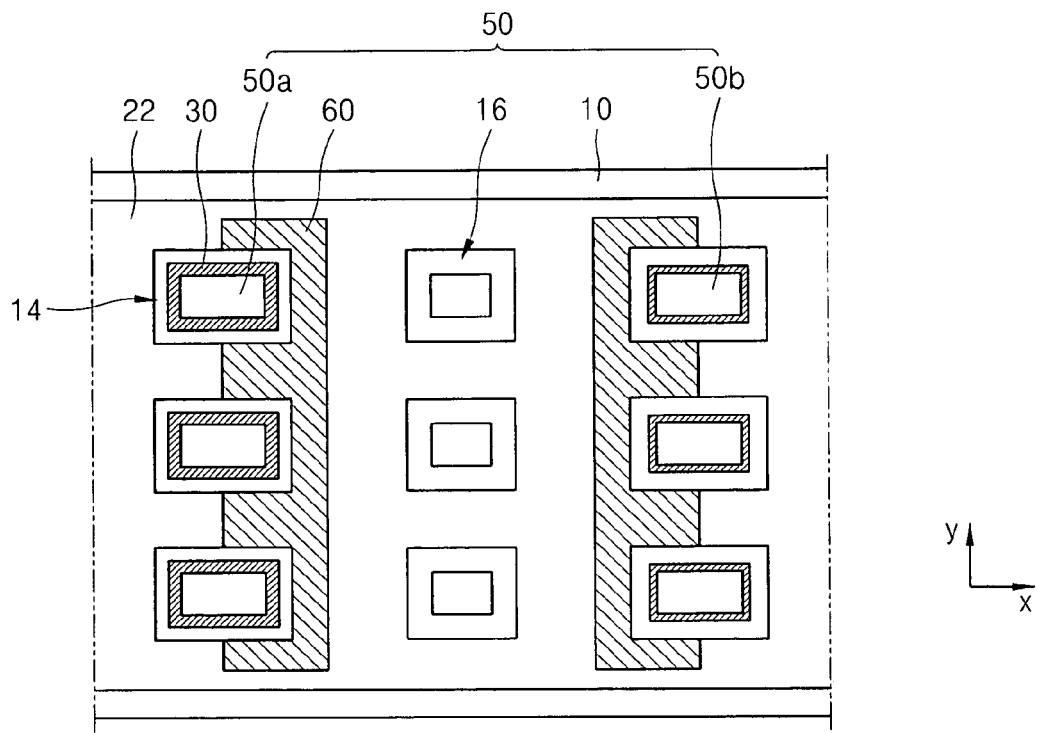
FIG. 7 is a top view showing a guide on a substrate according to an exemplary embodiment.

Preferably, as in the present embodiment, the guide 60 may be further formed on an edge between the second mask 22 and the second opening 14 through which the first electronic component 50 is exposed. In detail, FIG. 7 is a top view of the substrate 10 on which the guide 60 is positioned. Referring to FIG. 7, the second mask 22 including the second openings 14 and the third openings 16 positioned on the substrate 10, and the guide 60 is positioned between the second opening 14 and the third opening 16. For example, the guide 60 may be positioned on a portion of the second mask 22 between the second mask 22 and the second opening 14. The guide 60 may be further formed on an edge between the second mask 22 and the second opening 14. In order to reinforce the barrier function of the guide 60 to barrier an introduction of the second solder paste 32 into the first electronic component 50, the guide 60 may correspondingly surround at least one surface of the first electronic component 50.

Figure 9:
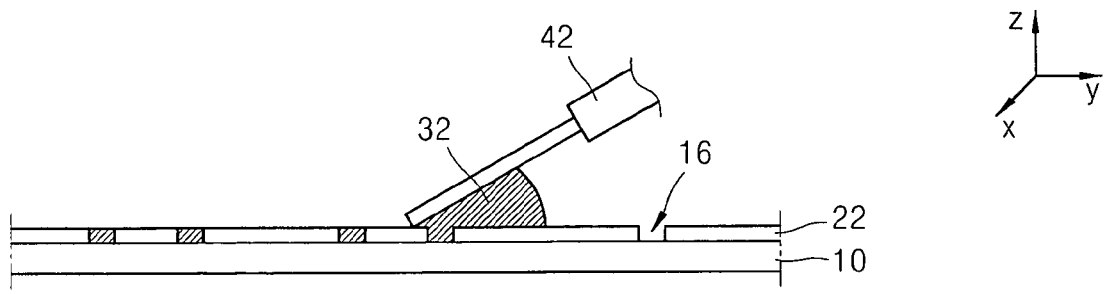

FIG. 8 is a cross-sectional view taken along an X-axis and FIG. 9 is a cross-sectional view taken along a Y-axis, illustrating that the second solder paste 32 is applied to the substrate 10.

Referring to FIGS. 8 and 9, the second solder paste 32 is applied to the substrate 10 on which the second mask 22 and the guide 60 are sequentially formed. The second solder paste 32 applied to the substrate 10 is forced into the third opening 16 by a second squeezer 42.

The second squeezer 42 may not contact the guide 60 and a portion of the second mask 22, which is around the second opening 14 through which the first electronic component 50 is exposed, but may contact a portion of the second mask 22, which is around the third opening 16. To this end, the second squeezer 42 may have at least one concave portion 44 that accommodates the first electronic component 50 and the guide 60. Alternatively, the second squeezer 42 may have concave portions 44, respectively accommodating the first electronic component 50 and the guide 60, or one concave portion 44 that accommodates both the first electronic component 50 and the guide 60.

The second solder paste 32 may have a melting temperature, that is, a soldering temperature, which is different from that of the first solder paste 30. For example, the first solder paste 30 may allow soldering at a relatively high temperature whereas the second solder paste 32 may allow soldering at a relatively low temperature. For example, if temperature limits under which the first electronic component 50 and a second electronic component 52 have reliabilities that are different from each other, the first electronic component 50 having a higher temperature limit may be soldered with the first solder paste 30, and the second electronic component 52 having a lower temperature limit may be soldered with the second solder paste 32. Accordingly, the first electronic component 50 and the second electronic component 52 having reliabilities under different temperature limits can be mounted on the same substrate while minimizing damage to the first electronic component 50 and the second electronic component 52.

Since a soldering temperature of a solder paste varies depending on elements, composition ratios, additives, and so on, a solder paste suitable for each electronic component is determined by considering a reliable temperature range, cost, environmental impact, etc.

Figure 10:
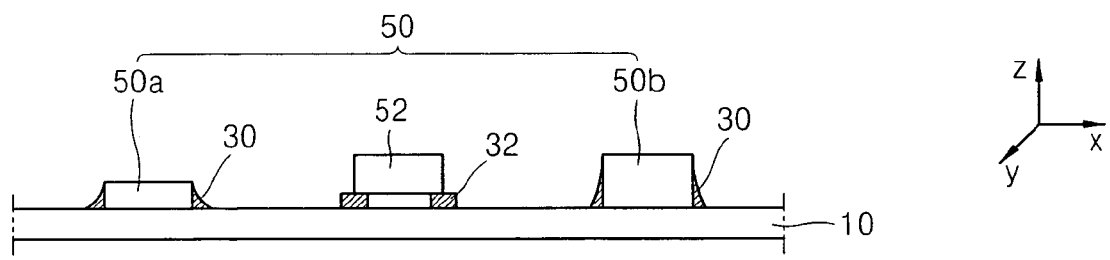
FIGS. 10-11 are cross-sectional views showing a second electronic component being mounted according to an exemplary embodiment.

Referring to FIG. 10, after the second solder paste 32 is applied, the guide 60 and the second mask 22 are removed. Hence, the second electronic component 52 is positioned on the second solder paste 32.

Figure 11:
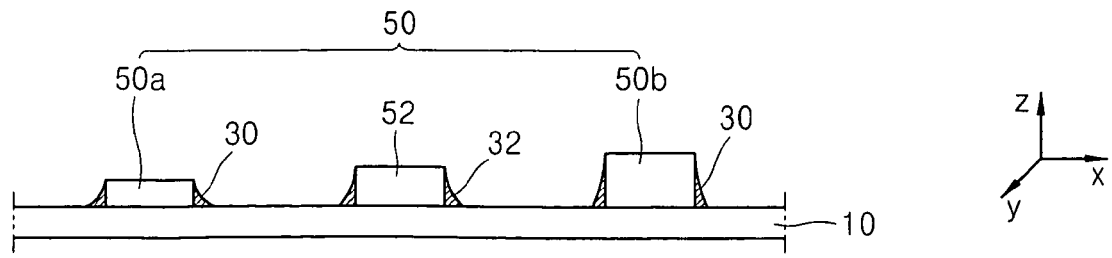

Referring to FIG. 11, the substrate 10 on which the second electronic component 52 is positioned is subjected to a reflow process in an oven, such that the second electronic component 52 is adhered onto the substrate 10. Thus, a heat treatment temperature during the reflow process for the second electronic component 52 may be lower than that during the reflow process for the first electronic component 50.

For example, if the first electronic component 50 can withstand a temperature of about 260° C. whereas the second electronic component 52 can withstand a temperature of about 200° C., the first solder paste 30 which is less expensive and has higher adhesive strength than the second solder paste 32 may be used for the first electronic component 50. If the second electronic component 52 is soldered with the first solder paste 30, the second electronic component 52 may not withstand a heat treatment during a reflow process and thus may be damaged. Accordingly, the second solder paste 32 having a lower melting temperature may be used for the second electronic component 52. For example, the first electronic component 50, which can withstand a higher temperature, is soldered and then the second electronic component 52, which can withstand a lower temperature, is soldered with the suitable solder pastes, and thus, both the first electronic component 50 and the second electronic component 52 can prevent damage such as a crack due to the heat treatment temperatures during the reflow processes.

As described above, the method and apparatus for mounting at least two types of electronic components according to the present invention can improve packaging reliability by applying two types of solder pastes having different melting temperatures on desired regions of the same substrate and mounting electronic components, having reliabilities under different temperature limits, while minimizing damage to the electronic components, irrespective of the heights of the electronic components.

Moreover, the method and apparatus for mounting at least two types of electronic components on the same substrate according to the present invention is suitable for electronic components, such as a digital camera, a cellular phone, a personal digital assistant (PDA), an MP3 player, and a portable multimedia player (PMP), which are being increasingly minimized.

While the present invention has been particularly shown and described with reference to exemplary embodiments thereof, it will be understood by one of ordinary skill in the art that various changes in form and details may be made therein without departing from the spirit and scope of the present invention as defined by the following claims.

What is claimed is:

1. A method of mounting at least two types of electronic components, the method comprising:
   mounting a first electronic component on a substrate;
   forming a mask on the substrate the mask having an opening to expose the first electronic component and a region of the substrate on which a solder paste is to be applied;
   forming a guide on a portion of the mask disposed around the first electronic component;
   applying the solder paste onto the substrate by using a squeezer contacting a portion of the mask disposed around the region of the substrate on which the solder paste is to be applied;
   removing the guide and the mask; and
   mounting a second electronic component on the solder paste.

2. The method of claim 1, wherein the guide is formed on the portion of the mask disposed around the first electronic component, so as to prevent the solder paste from being introduced into the first electronic component.

3. The method of claim 1, wherein the guide is formed on a portion of the mask disposed between the first electronic component and the region of the substrate on which the solder paste is to be applied.

4. The method of claim 3, wherein the guide is formed on a portion of the mask between an opening through which the first electronic component is exposed and an opening through which the region of the substrate on which the solder paste is to be applied is exposed.

5. The method of claim 4, wherein the guide is further formed on an edge between the mask and the opening through which the first electronic component is exposed.

6. The method of claim 1, wherein the solder paste is applied by using the squeezer having at least one concave portion that accommodates the first electronic component and the guide.

7. The method of claim 1, wherein the solder paste is applied by using the squeezer having a concave portion that accommodates both the first electronic component and the guide.

8. A method of mounting at least two kinds of electronic components, the method comprising:
   forming a first mask on a substrate the mask having an opening to expose a region of the substrate on which a first solder paste is to be applied;
   applying the first solder paste onto the substrate by using a first squeezer;
   removing the first mask;
   mounting a first electronic component on the first solder paste;
   forming a second mask on the substrate on which the first electronic component is mounted to expose the first electronic component and a region of the substrate on which a second solder paste is to be applied;
   forming a guide on a portion of the second mask disposed around the first electronic component;
   applying the second solder paste onto the substrate by using a second squeezer having at least one concave portion that accommodates the first electronic component and the guide;
   removing the second mask and the guide; and
   mounting a second electronic component on the second solder paste.

9. The method of claim 8, wherein the mounting of the first electronic component comprises positioning the first electronic component on the first solder paste and applying heat at a first temperature, and
   the mounting of the second electronic component comprises positioning the second electronic component on the second solder paste and applying heat at a second temperature that is different from the first temperature.

10. The method of claim 9, wherein the first temperature is higher than the second temperature.

11. The method of claim 8, wherein the applying of the first solder paste comprises applying the first solder paste by using the first squeezer contacting a portion of the first mask disposed around the region of the substrate on which the first solder paste is to be applied, and
    the applying of the second solder paste comprises applying the second solder paste by using the second squeezer contacting a portion of the second mask disposed around the region of the substrate on which the second solder paste is to be applied.

12. The method of claim 8, wherein the first solder paste is applied by using the first squeezer having no concave portion, and
    the second solder paste is applied by using the second squeezer having a concave portion that accommodates the first electronic component and the guide.

* * * * *